US007183151B2

(12) United States Patent
Park

(10) Patent No.: US 7,183,151 B2
(45) Date of Patent: Feb. 27, 2007

(54) METHOD FOR FABRICATING FIELD EFFECT TRANSISTOR

(75) Inventor: Mi Ran Park, Daejeon-Shi (KR)

(73) Assignee: Electronics and Telecommunications Research Institute, Daejeon-shi (KR)

( * ) Notice: Subject to any disclaimer, the term of this patent is extended or adjusted under 35 U.S.C. 154(b) by 27 days.

(21) Appl. No.: 10/919,416

(22) Filed: Aug. 17, 2004

(65) Prior Publication Data

US 2005/0142709 A1 Jun. 30, 2005

(30) Foreign Application Priority Data

Dec. 26, 2003 (KR) .................. 10-2003-0097272

(51) Int. Cl.
*H01L 21/336* (2006.01)

(52) U.S. Cl. ..................................... 438/197
(58) Field of Classification Search ................ 438/172, 438/197; 257/40
See application file for complete search history.

(56) References Cited

U.S. PATENT DOCUMENTS 5,500,381 A * 3/1996 Yoshida et al. ............. 438/172
6,756,605 B1 * 6/2004 Reed et al. ................... 257/40

FOREIGN PATENT DOCUMENTS

KR 1020030062792 7/2003

OTHER PUBLICATIONS

Hong et al.; "Cryogenic Processed Metal-Semiconductor-Metal (MAM) Photodetectors on MBE Grown ZnSe"; IEEE Transactions on Electron Devices; Jun. 1999; pp. 1127-1134.

* cited by examiner

*Primary Examiner*—Carl Whitehead, Jr.
*Assistant Examiner*—Monica D. Harrison
(74) *Attorney, Agent, or Firm*—Mayer Brown Rowe & Maw LLP

(57) ABSTRACT

Provided is a method for fabricating a filed effect transistor, the method comprising: depositing a first semiconductor layer and a second semiconductor layer on a substrate in sequence, which have a different bandgap from each other, and patterning the second semiconductor layer to have a mesa structure; forming a first resist pattern to expose the second semiconductor layer of a region where source and drain are to be formed; depositing a metal on a whole upper surface, and forming metallic source and drain by performing a lift-off process; performing heat treatment to form an ohmic contact between the source and the second semiconductor layer, and between the drain and the semiconductor layer; forming an insulating layer on the whole upper surface including the source and the drain, and forming a second photoresist pattern to expose the insulating layer at a portion where a gate is to be formed; exposing the second semiconductor layer at the portion where the gate is to be formed by etching the exposed portion of the insulating layer; and depositing the metal on the whole upper surface in a state that the temperature of the substrate is lowered to perform low temperature vacuum deposition, and forming a metallic gate by performing a lift-off process and an insulating layer removing process.

8 Claims, 4 Drawing Sheets

METHOD FOR FABRICATING FIELD EFFECT TRANSISTOR

BACKGROUND

1. Field of the Invention

The present invention generally relates to methods for fabricating field effect transistors, and more particularly, to methods for fabricating filed effect transistors to improve schottky contact characteristics having a major effect on electrical characteristics of field effect transistors using nitride semiconductors.

2. Discussion of Related Art

A field effect transistor using a nitride semiconductor having a high bandgap, there is a high electron mobility transistor (HEMT), a heterojunction field effect transistor (HFET), etc. Such a field effect transistor, as shown in FIG. 1, is composed of: first and second semiconductor layers 2 and 3 having a different bandgap from each other to form a heterojunction and deposited on a substrate 1 in sequence; source 4a and drain 4b forming an ohmic contact between the second semiconductor layer 3 used as a device region and a metal; and a gate 5 forming a schottky contact between the second semiconductor layer 3 and the metal.

When positive voltage is applied to the drain 4b against the source 4a, the electric field created between the drain 4b and the source 4a causes electrons to move from the source 4a to the drain 4b. At this time, the amount of electric current flowing through a channel is adjusted depending on the thickness of a depletion layer formed according to the voltage applied to the gate 5. For this rectifying action, the gate 5 needs the schottky contact. Thus, a schottky barrier, a backward characteristic, and a leakage current characteristic act as major factors to improve an HEMT device, particularly, amplifying efficiency, power performance, and frequency characteristic of an HEMT power amplifier.

The nitride semiconductor has large bandgap energy and causes the Fermi level pinning phenomenon that a Fermi level is pinned to a predetermined level, when it contacts a metal. Therefore, in forming the schottky contact having a high barrier using the nitride semiconductor, 1) the Fermi level is pinned after performing the surface treatment to reduce a surface defect of the semiconductor causing the Fermi level pining phenomenon, or 2) a high work function metal is used. Generally, as the metal used for the schottky contact, there are platinum (Pt), nickel (Ni), ruthenium (Ru), iridium (Ir), etc. However, such metal still has only a low schottky barrier but also needs a subsequent heat treatment process.

As a conventional deposition method, an electron-beam method, a heating method, or a sputtering method has generally been used to form a metal contact. In the case where such deposition methods are used to deposit a metal on the surface of the semiconductor, an electric current is used for evaporating the metal. At this time, the electric current generates heat, thereby increasing the temperature of the semiconductor substrate. However, when the metal is deposited on the semiconductor surface at a room temperature or beyond, the metal not only contacts the semiconductor surface but also changes the states of the semiconductor surface, thereby creating defects. Such defects act as a cause of the Fermi level pining phenomenon. Furthermore, during the heat treatment process performed after the metal deposition, the doping concentration of the semiconductor surface can be changed by reaction between the metal and the semiconductor, and a non-uniform contact surface is formed by the unevenly concentrated metal. The changed doping concentration and the non-uniform contact surface act as a cause for generating other defects on the semiconductor surface to have, thereby lowering the schottky barrier height.

SUMMARY OF THE INVENTION

Accordingly, the present invention is directed to a method of fabricating a field effect transistor, in which reaction is prevented at a boundary between a semiconductor and a metal and defects of a semiconductor surface are decreased, thereby forming a schottky contact gate having high barrier, low leakage current, high breakdown voltage characteristics.

The present invention is also directed to a method of fabricating a field effect transistor having improved characteristics.

One aspect of the present invention is to provide a method for fabricating a field effect transistor, the method comprising: depositing a first semiconductor layer and a second semiconductor layer on a substrate in sequence, which have a different bandgap from each other, and patterning the second semiconductor layer to have a mesa structure; forming a first resist pattern to expose the second semiconductor layer of a region where source and drain are to be formed; depositing a metal on a whole upper surface, and forming metallic source and drain by performing a lift-off process; performing heat treatment to form an ohmic contact between the source and the second semiconductor layer, and between the drain and the semiconductor layer; forming an insulating layer on the whole upper surface including the source and the drain, and forming a second photoresist pattern to expose the insulating layer at a portion where a gate is to be formed; exposing the second semiconductor layer at the portion where the gate is to be formed by etching the exposed portion of the insulating layer; and depositing the metal on the whole upper surface in a state in which the temperature of the substrate is lowered to perform low temperature vacuum deposition, and forming a metallic gate by performing a lift-off process and an insulating layer removing process.

In one embodiment, the metal for the gate is deposited by an electron-beam or thermal evaporator. Preferably, the heat treatment for the ohmic contact is performed at a temperature ranging from 300° C. to 900° C.

In another embodiment, the temperature of the substrate is lowered by liquid nitrogen, and the metal is deposited in a state that the temperature of the substrate is lowered to 77K through 100 k.

Finally, in one embodiment, the low temperature vacuum deposition comprises: loading the substrate into a chamber of the vacuum evaporator and mounting the substrate to a substrate holder; lowering the temperature of the substrate by supplying the liquid nitrogen into the chamber; depositing the metal on the substrate in a vacuum state; increasing the temperature of the substrate to a room temperature by applying DC power to the substrate holder; and unloading the substrate from the chamber.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification. In the accompanying drawings, various elements and regions are schematically illustrated, and its relative size and intervals are not limited thereto.

Figure 1:
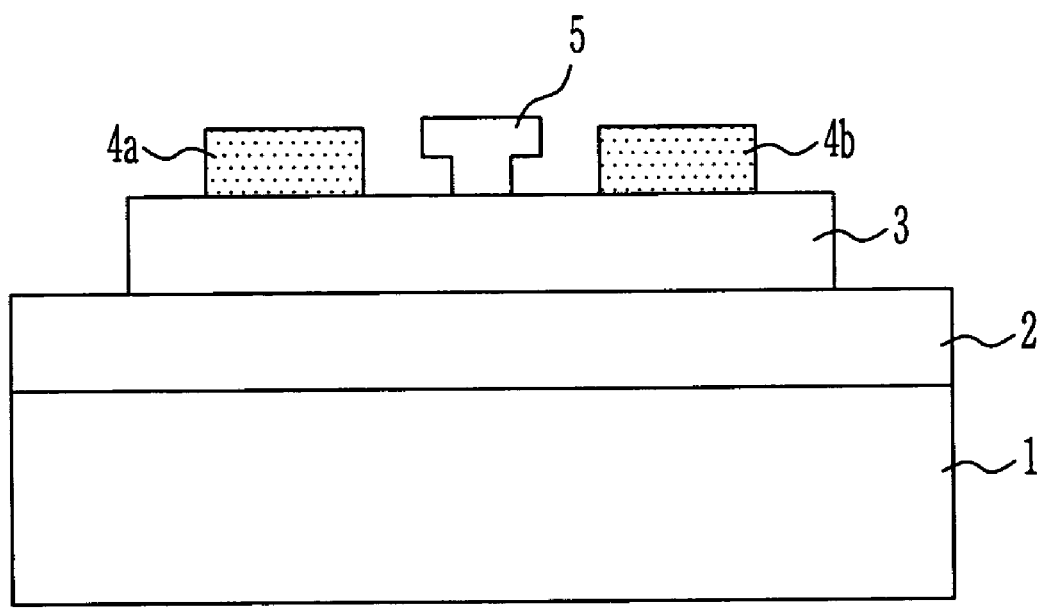
FIG. 1 is a cross-sectional view illustrating a conventional field effect transistor using a nitride semiconductor.
Figure 2:
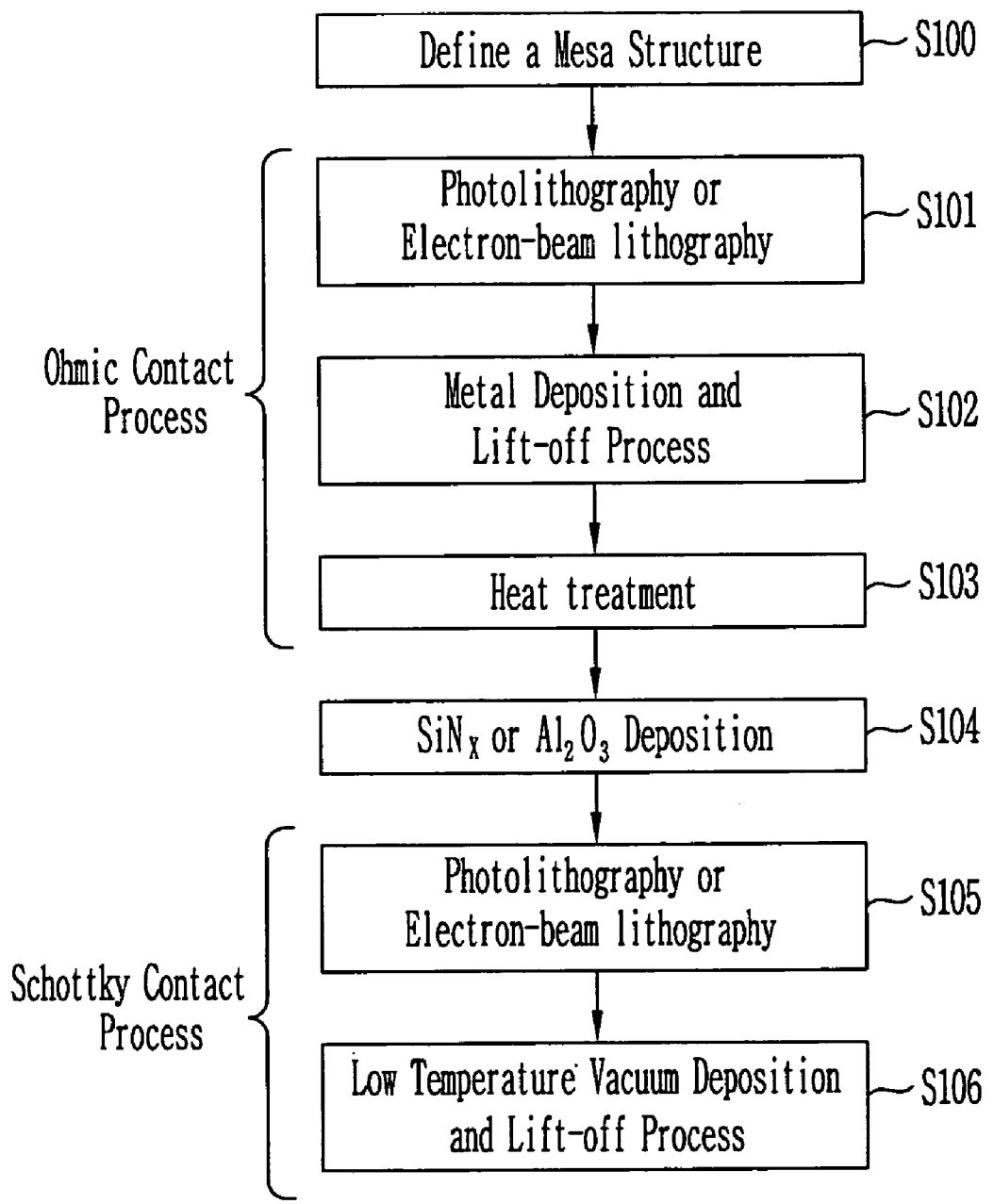
FIG. 2 is a flow chart illustrating a method of fabricating a field effect transistor according to an embodiment of the present invention.
Figure 3A:
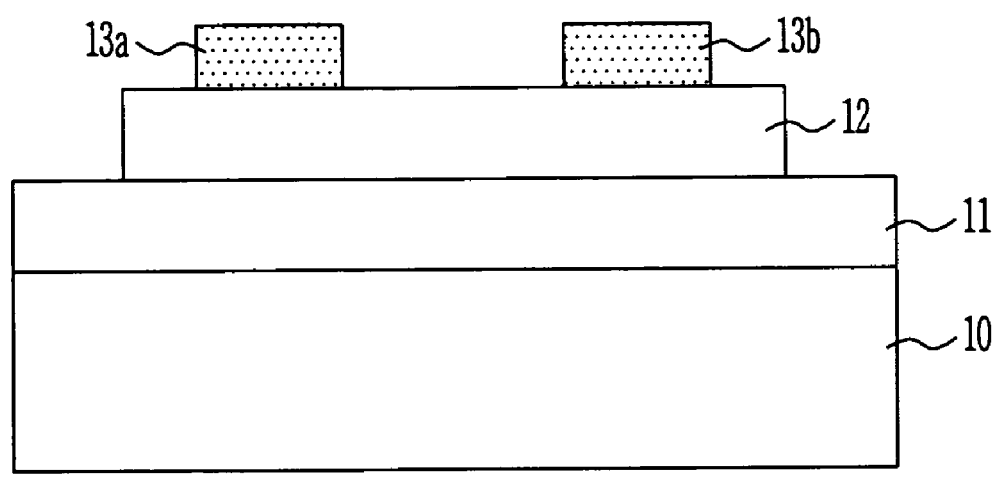
FIGS. 3A through 3C are cross-sectional views illustrating a process of fabricating a field effect transistor according to an embodiment of the present invention.
Figure 3B:
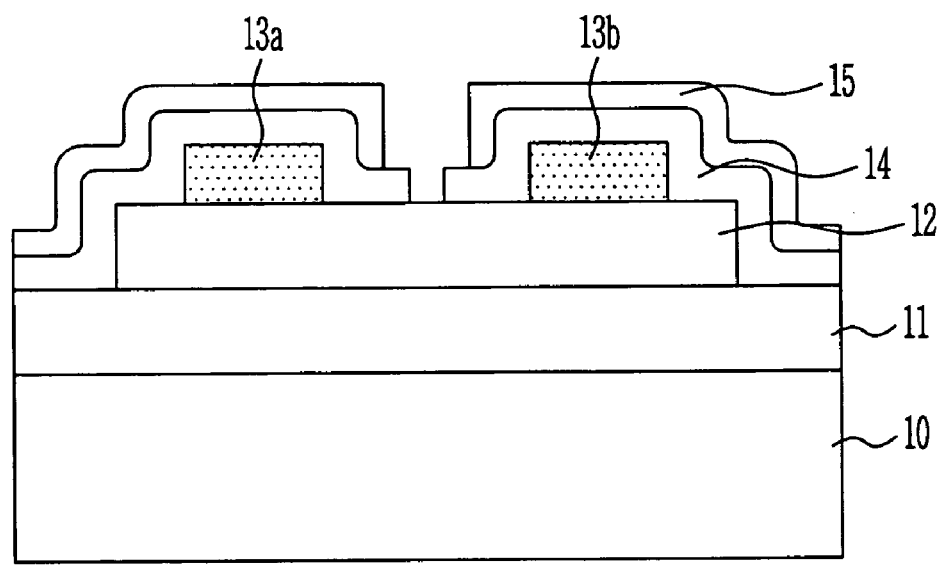
Figure 3C:
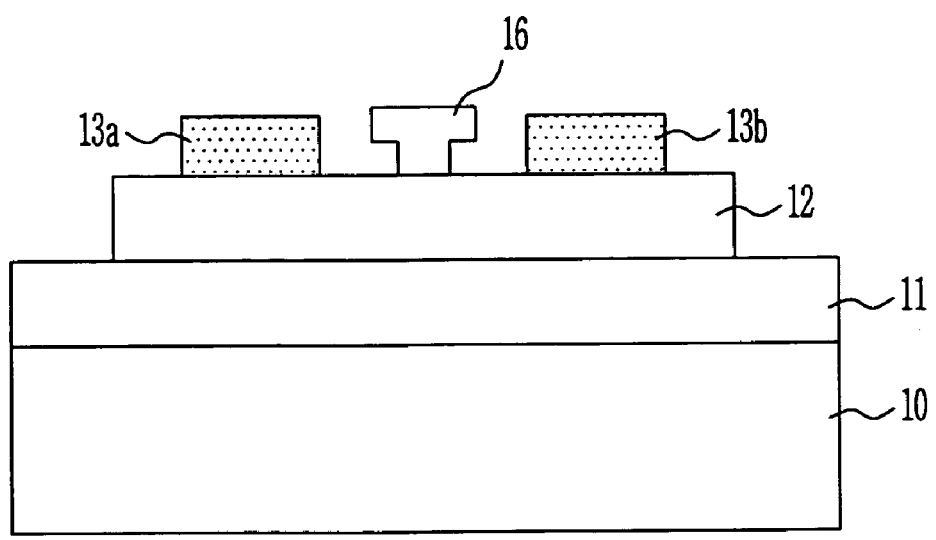

FIG. 2 is a flow chart illustrating a method of fabricating a field effect transistor according to an embodiment of the present invention, and FIGS. 3A through 3C are cross-sectional views for illustrating the process of fabricating a field effect transistor according to an embodiment of the present invention.

[Step 1: S100]

As shown in FIG. 3A, a first semiconductor layer 11 and a second semiconductor layer 12 are deposited on a substrate 10 in sequence, which have a different bandgap from each other to form a heterojunction. Then, the second semiconductor layer 12 is patterned to define a device region of a mesa structure.

[Step 2: S101]

A first resist pattern (not shown) is formed on the second semiconductor layer 12 by a photolithography or electron-beam lithography process so as to expose a region where source and drain will be formed.

[Step 3: S102]

A metal is deposited on the whole upper surface by an electron-beam or a thermal evaporator so as to form the ohmic contact. Then, the metal unnecessarily deposited on the first resist pattern is removed by a lift-off process, thereby forming the source 13a and drain 13b made of the metal. At this time, the metal may have a multi-layered structure to form the source 13a and the drain 13b.

[Step 4: S103]

The source and drain 13a and 13b, and the second semiconductor layer 12 are subjected to the heat treatment to form the ohmic contact. At this time, the temperature of the heat treatment is determined in consideration of growth temperature of the substrate, physical and chemical characteristics between the substrate and the metal, and purpose of the ohmic contact. For example, in the case of a GaN/Al$_x$Ga$_{1-x}$N HEMT device, the heat treatment is performed at a temperature of 300° C. or more, i.e., 300° C.~900° C.

[Step 5: S104]

As shown in FIG. 3B, an insulating layer 14 is formed by depositing silicon nitride (SiN$_x$), silicon dioxide (SiO$_2$), aluminum oxide (Al$_2$O$_3$), etc. on the whole upper surface including the source 13a and the drain 13b. Here, the insulating layer 14 is used for forming a T- or gamma-gate and for forming a schottky gate using a low temperature deposition method.

[Step 6: S105]

The second photoresist pattern 15 is formed by the photolithography process or the electron-beam lithography process to expose a predetermined portion of the insulating layer 14 where a gate between the source 13a and the drain 13b will be formed. Then, the insulating layer 14 is etched at the exposed portion, thereby exposing the second semiconductor layer 12 where the gate will be formed.

[Step 7: S106]

The metal is formed on the whole upper surface by the low temperature vacuum deposition in the state that the temperature of the substrate 10 is lowered to a temperature of 77K using liquid nitrogen to perform the low temperature vacuum deposition. Then, the metal unnecessarily formed on the second resist pattern 15 is removed during the lift-off process and the insulating layer removing process, thereby forming the gate 16 made of the metal (refer to FIG. 3C).

The low temperature vacuum deposition is performed in a chamber of the vacuum evaporator. The vacuum evaporator comprises a metallic sample holder with a thermocouple and a cryostat. Here, the substrate 10 is loaded into the chamber and mounted to a substrate holder, and then the liquid nitrogen is supplied from the cryostat connected to the vacuum evaporator toward the substrate 10, thereby lowering the temperature of the substrate 10 to the temperature of the liquid nitrogen, i.e., about 77K. In the state that the temperature of the substrate 10 ranges from 77K to 100K, the metal is deposited. At this time, the inside of the vacuum evaporator has a vacuum of $10^{-8}$ torr. After the metal is deposited at the low temperature, DC power is slowly applied to the substrate holder and makes the substrate 10 have the room temperature. When the substrate 10 has the room temperature, a manufacturer opens the chamber and unloads the substrate 10 from the chamber. Then, the unnecessary metal and second resist pattern 15 are removed by the lift-off process and the insulating layer removing process.

In the case where the temperature of the substrate is lowered to 77K by the liquid nitrogen, the resist pattern formed on the substrate is damaged at the low temperature of 77 k, so that it is difficult to perform the lift-off process for forming the gate. In particular, the problem arises that the metal pattern is not clearly formed; its edges are ill-defined, etc. To solve these problems, the present invention provides the insulating layer under the photoresist pattern. According as the insulating layer is formed under the photoresist pattern, the metal which is not completely removed by the lift-off process and remained can be completely removed by removing the insulating layer deposited under the photoresist pattern.

As described above, according to the present invention, the metal for the gate is deposited by the low temperature vacuum deposition method in the state that the temperature of the substrate is lowered by the liquid nitrogen, so that the schottky contact has a high schottky barrier. Further, according to the present invention, there is no chemical reaction between the metal and the semiconductor because the high temperature heat treatment is not performed, so that it is possible to prevent defects from occurring on the semiconductor surface and prevent the metal from diffusing or alloying. Also, the metal is prevented from aggregation, hillock and balling-up phenomena, thereby enhancing morphology and uniformity of the metal. Besides, the metal is prevented from horizontal expansion, thereby securing an active region based on a designed size. Thus, in the field effect transistor according to the present invention, design reliability is kept, a short-circuit is prevented, and a production cost is decreased because the number of fabricating process thereof is decreased, that is, not only there is no additional process due to the low temperature deposition but also the heat treatment process is unnecessary.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A method for fabricating a field effect transistor, the method comprising:

depositing a first semiconductor layer and a second semiconductor layer on a substrate in sequence, which have a different bandgap from each other, and patterning the second semiconductor layer to have a mesa structure;

forming a first resist pattern to expose the second semiconductor layer of a region where source and drain are to be formed;

depositing a metal on a whole upper surface, and forming metallic source and drain by performing a lift-off process;

performing heat treatment to form an ohmic contact between the source and the second semiconductor layer, and between the drain and the semiconductor layer;

forming an insulating layer on the whole upper surface including the source and the drain, and forming a second photoresist pattern to expose the insulating layer at a portion where a gate is to be formed;

exposing the second semiconductor layer at the portion where the gate is to be formed by etching the exposed portion of the insulating layer; and depositing the metal on the whole upper surface in a state that the temperature of the substrate is lowered to perform low temperature vacuum deposition, and forming a metallic gate by performing a lift-off process and an insulating layer removing process.

2. The method as claimed in claim 1, wherein the metal for the gate is deposited by an electron-beam or thermal evaporation method.

3. The method as claimed in claim 1, wherein the heat treatment for the ohmic contact is performed at a temperature ranging from 300° C. to 900° C.

4. The method as claimed in claim 1, wherein the insulating layer is formed of any one of silicon nitride (SiNx), silicon dioxide (SiO2), and aluminum oxide (Al2O3) for low temperature deposition.

5. The method as claimed in claim 1, wherein the temperature of the substrate is lowered by liquid nitrogen.

6. The method as claimed in claim 1, wherein the metal is deposited in a state that the temperature of the substrate is lowered to 77K through 100 k.

7. The method as claimed in claim 1, wherein the low temperature vacuum deposition comprises:

loading the substrate into a chamber of the vacuum evaporator and mounting the substrate to a substrate holder;

lowering the temperature of the substrate by supplying the liquid nitrogen into the chamber;

depositing the metal on the substrate in a vacuum state;

increasing the temperature of the substrate to a room temperature by applying DC power to the substrate holder; and unloading the substrate from the chamber.

8. The method as claimed in claim 7, the chamber is provided with a cryostat for the low temperature deposition.

* * * * *